United States Patent
Cho et al.

(10) Patent No.: US 10,204,873 B2
(45) Date of Patent: Feb. 12, 2019

(54) BREAKABLE SUBSTRATE FOR SEMICONDUCTOR DIE

(71) Applicant: Infineon Technologies Americas Corp., El Segundo, CA (US)

(72) Inventors: Eung San Cho, Torrance, CA (US); Chuan Cheah, Torrance, CA (US)

(73) Assignee: Infineon Technologies Americas Corp., El Segundo, CA (US)

( * ) Notice: Subject to any disclaimer, the term of this patent is extended or adjusted under 35 U.S.C. 154(b) by 0 days.

(21) Appl. No.: 15/589,493

(22) Filed: May 8, 2017

(65) Prior Publication Data

US 2018/0323156 A1 Nov. 8, 2018

(51) Int. Cl.
| | |
|---|---|
| H01L 23/00 | (2006.01) |
| H01L 21/48 | (2006.01) |
| H01L 23/31 | (2006.01) |
| H01L 23/498 | (2006.01) |
| B41J 2/175 | (2006.01) |
| H01L 21/768 | (2006.01) |

(52) U.S. Cl.
CPC .......... H01L 23/573 (2013.01); B41J 2/1753 (2013.01); H01L 21/486 (2013.01); H01L 23/3121 (2013.01); H01L 23/49811 (2013.01); H01L 23/49827 (2013.01); H01L 23/49838 (2013.01); H01L 21/4814 (2013.01); H01L 21/4846 (2013.01); H01L 21/76894 (2013.01); H01L 21/76897 (2013.01); H01L 21/76898 (2013.01)

(58) Field of Classification Search
CPC ... H01L 21/78; H01L 21/486; H01L 21/4814; H01L 21/4846; H01L 21/4896; H01L 21/4842; H01L 21/67092; H01L 21/76894; H01L 21/76897; H01L 21/76898; H01L 23/49827
See application file for complete search history.

(56) References Cited

U.S. PATENT DOCUMENTS

| | | | | |
|---|---|---|---|---|
| 8,803,206 B1 * | 8/2014 | Or-Bach | ............. | H01L 25/0657 257/278 |
| 8,816,505 B2 * | 8/2014 | Mohammed | ...... | H01L 21/76898 257/621 |
| 9,793,522 B2 * | 10/2017 | Bhardwaj | ............... | H01M 2/08 |
| 9,950,923 B1 * | 4/2018 | Gudeman | .......... | H01L 21/76877 |
| 10,014,218 B1 * | 7/2018 | Shih | ........................ | H01L 21/78 |
| 2007/0087587 A1 * | 4/2007 | Chang | ................. | H01L 21/4803 439/66 |
| 2010/0164096 A1 * | 7/2010 | Daubenspeck | ......... | H01L 24/03 257/737 |
| 2011/0278741 A1 * | 11/2011 | Chua | ..................... | H01L 21/561 257/777 |

(Continued)

*Primary Examiner* — Mohsen Ahmadi
(74) *Attorney, Agent, or Firm* — Shumaker & Sieffert, P.A.

(57) ABSTRACT

In some examples, a device includes a substrate and a conductive pad extending through the substrate, wherein the substrate is coupled to the conductive pad at an interface and the substrate extends laterally from the interface to define a substrate extension. In some examples, the device also includes a semiconductor die mounted on the first side of the substrate. In some examples, the device includes a breakpoint that defines a torque tolerance that is less than a torque tolerance of the device at other points. In some examples, the device is configured to break at the breakpoint in response to force being applied to the substrate extension on the first side of the substrate.

20 Claims, 7 Drawing Sheets

(56) References Cited

U.S. PATENT DOCUMENTS

| | | | |
|---|---|---|---|
| 2012/0018898 A1* | 1/2012 | Ebefors | B81B 7/0006 257/774 |
| 2015/0179895 A1* | 6/2015 | Herner | H01L 27/156 257/89 |
| 2016/0307823 A1* | 10/2016 | Fang | H01L 23/481 |
| 2017/0047310 A1* | 2/2017 | Shim | H01L 25/0657 |
| 2018/0040469 A1* | 2/2018 | Seddon | B24B 7/228 |

* cited by examiner

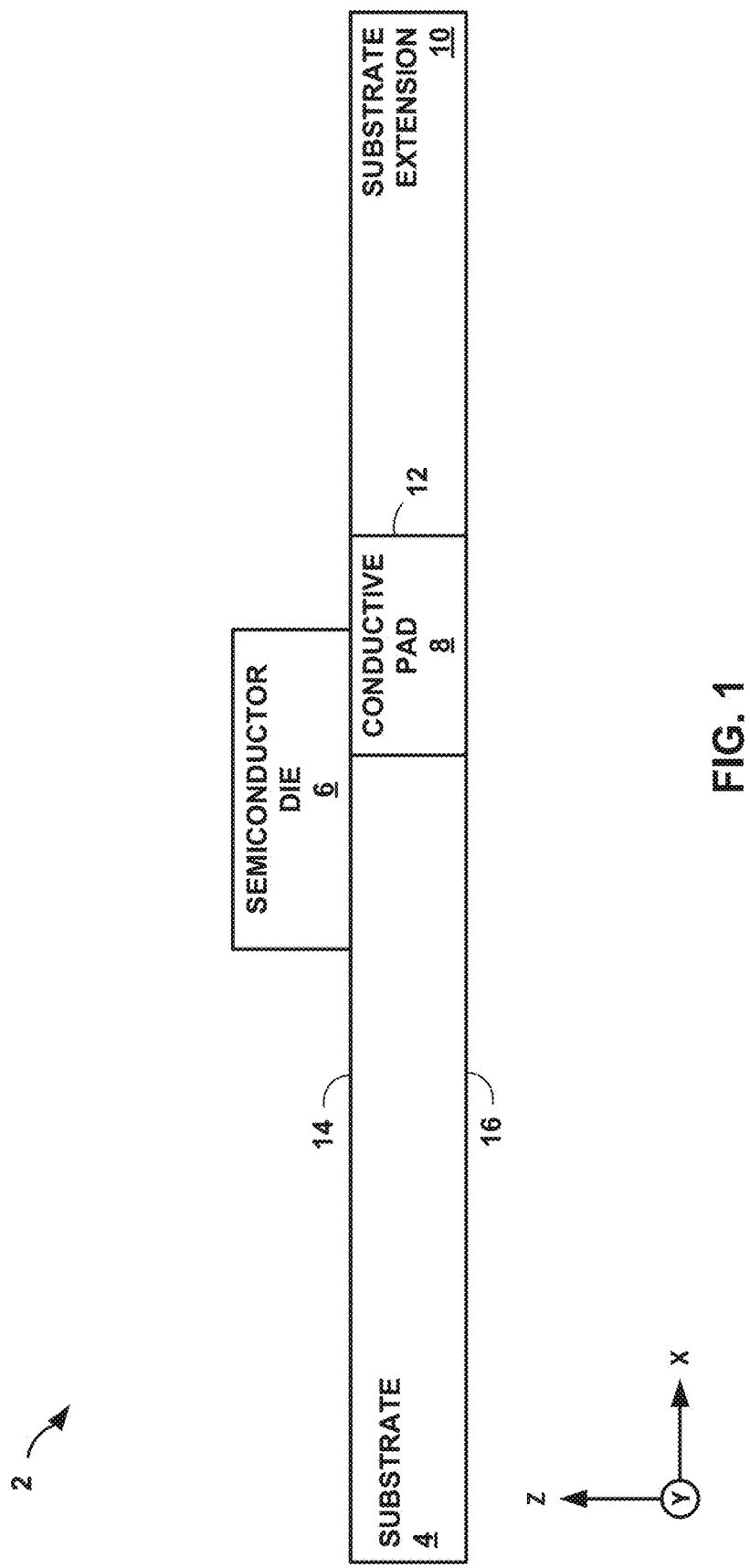

BREAKABLE SUBSTRATE FOR SEMICONDUCTOR DIE

TECHNICAL FIELD

This disclosure relates to electronic circuitry and packaging for electronic circuitry.

BACKGROUND

Authentication circuitry may be used in a device to ensure that authorized parts are used in systems to prevent damage to the systems. Example devices include inkjet cartridges and power cords for electronics. In some examples, a user may remove the authentication circuitry from a device and reuse the authentication circuitry on an unauthorized device.

For electronic devices, especially higher-end devices, authentication circuitry may be positioned on the device such that the authentication circuitry is not exposed and not easily detected by an end user. The authentication circuitry may be fully covered with additional material or with a case. In some examples, such as an inkjet cartridge, the input-output (IO) pads of the authentication circuitry may be exposed so that the IO pads may electrically connect to a printer through a socket when the cartridge is placed in the printer.

SUMMARY

This disclosure describes techniques for constructing a device including authentication circuitry mounted on a breakable substrate. The breakable substrate may be constructed to increase the likelihood that the device will break when a user attempts to remove the device from a larger system. In some examples, if the substrate breaks, the user may not be able to perform an unauthorized modification of the device. Certain characteristics of the device may increase the likelihood that the substrate will break when force is applied to the substrate. These characteristics include the configuration of an interface between the substrate and a conductive pad, the shape of a conductive pad, the depth of a recess in the substrate, and other characteristics.

In some examples, a device includes a substrate and a conductive pad extending through the substrate, wherein the substrate is coupled to the conductive pad at an interface and the substrate extends laterally from the interface to define a substrate extension. The device also includes a semiconductor die mounted on the first side of the substrate. The device also includes a breakpoint that defines a torque tolerance that is less than a torque tolerance of the device at other points. The device is configured to break at the breakpoint in response to force being applied to the substrate extension on the first side of the substrate.

In some examples, a method includes forming a device including a conductive pad extending through a substrate, wherein the substrate is coupled to the conductive pad at an interface and the substrate extends laterally from the interface to define a substrate extension. The device includes a breakpoint that defines a torque tolerance that is less than a torque tolerance of the device at other points, and the device is configured to break at the breakpoint in response to force being applied to the substrate extension on the first side of the substrate. The method also includes mounting a semiconductor die on the first side of the substrate, wherein mounting the semiconductor die includes electrically connecting the semiconductor die to the conductive pad.

In some examples, a device includes a substrate and a conductive pad extending through the substrate, wherein an exposed surface area of the conductive pad on a first side of the substrate is greater than an exposed surface area of the conductive pad on a second side of the substrate. The substrate is coupled to the conductive pad at an interface and the substrate extends laterally from the interface to define a substrate extension. The device also includes a semiconductor die mounted on the first side of the substrate and electrically connected to the conductive pad. The device further includes an outer conductive element positioned on a first side of the substrate extension, wherein the substrate extension defines a recess that is positioned between the semiconductor die and the outer conductive element. The device includes a first breakpoint at the interface and a second breakpoint at the recess, wherein each breakpoint of the first breakpoint and the second breakpoint defines a torque tolerance that is less than a torque tolerance of the device at other points. The device is configured to break at the first breakpoint or the second breakpoint in response to force being applied to the substrate extension on the first side of the substrate.

The details of one or more examples are set forth in the accompanying drawings and the description below. Other features, objects, and advantages will be apparent from the description and drawings, and from the claims.

BRIEF DESCRIPTION OF DRAWINGS

FIG. 1 is a conceptual block diagram of a semiconductor die mounted on a substrate, in accordance with some examples of this disclosure.

DETAILED DESCRIPTION

Figure 2A:
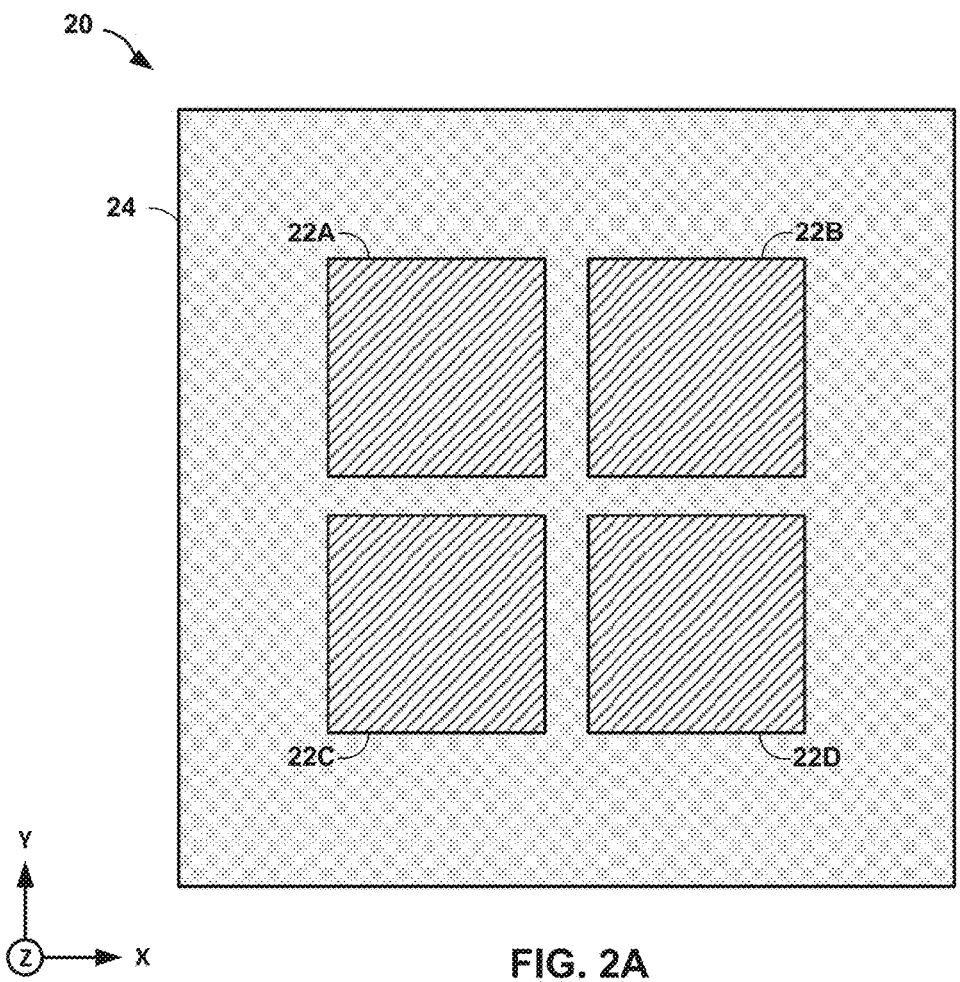
FIG. 2A is a bottom-view diagram of a device including conductive pads, in accordance with some examples of this disclosure.

This disclosure describes circuits and techniques for constructing a device that includes a breakable substrate, a conductive pad, and a semiconductor die mounted on the substrate. The substrate may include a breakpoint that defines a torque tolerance that is less than a torque tolerance of the device at other points. The device may be configured to break at the breakpoint in response to a force being applied to the substrate extension. In some examples, the semiconductor die may include authentication circuitry, such that breakage of the device may prevent a system from functioning properly.

In some examples, a user may attempt to use an unauthorized part for an electronics device. A user may also attempt to modify a system by removing an authentication device, modifying the authentication device, and reattaching the authentication device after the modification. A user may attempt to remove the authentication circuitry from an authorized device and place it on an unauthorized device to allow the unauthorized device to operate similar to the authorized device. The authentication circuitry may be mounted on a printed circuit board (PCB). The PCB may include robust and relatively thick FR4 (flame-retardant) material. If the authentication circuitry is mounted on a robust PCB, a user may remove and reuse the authentication circuitry without breaking the PCB. The modification of the device by the user may reduce the quality of the device and/or the quality of the system. In some examples, the user may attempt to sell the modified device or system on a secondary market, causing damage to the brand reputation of the original manufacturer due to the lower quality of the modified device.

A printer cartridge, such as an inkjet cartridge, is one example of a device that may be modified (e.g., refilled) and reused by an end user. The manufacturer may perform strict quality control of the cartridge to ensure that the manufacturer's brand name is associated with a high-quality product. A refurbishing company may refill the printer cartridge and sell the refilled cartridge. The refilled cartridge may include lower-quality ink, or the refilled cartridge may have inferior performance, as compared to an original cartridge sold by the manufacturer. Customers may associate the refilled cartridge or a modified printer device with the original manufacturer, rather than the refurbishing company, and the brand reputation of the original manufacturer may suffer as a result. To prevent refilling, the manufacturer may position the authentication circuitry to block refilling of the printer cartridge. However, a user may attempt to remove the authentication circuitry, refill the cartridge with ink, and reattach the authentication circuitry.

To prevent removal and/or reuse of the authentication circuitry, the manufacturer may configure the authentication circuitry to break when a user attempts to remove the authentication circuitry from the device. In some examples, it may be desirable for the device to be relatively fragile or weak, so that a user cannot misuse the device or the larger system. Rather than using a substrate like FR4 that may be overly robust for purposes of the authentication circuitry, the authentication circuitry may be mounted on a substrate that includes fragile material. The thickness of the substrate may thin enough such that the substrate may be configured to break when a user attempts to remove the substrate. The substrate may include contacts that are exposed on one or both sides of the substrate. The substrate may be more robust in one direction and more fragile in another direction so that the substrate and/or a trace on the substrate breaks more easily to prevent the reuse of the authentication circuitry.

In some examples, a PCB device may include authentication circuitry in an integrated circuit (IC) mounted on a PCB made of FR4. The PCB device may include a slot for a screw to mount on a second device, such as a printer cartridge. The PCB device may be relatively easy to reuse by removing the screw to refill the cartridge with ink. Another device may include chip-on-board (COB) technology for an inkjet printer cartridge without a slot for a screw. The substrate of the other device may be robust (i.e., not easily breakable), even when a user attempts to detach the substrate from the cartridge. In some examples, COB technology may include a semiconductor die mounted on a PCB.

A device of this disclosure may include a pre-molded leadframe with a thickness of less than two hundred micrometers. In some examples, a thickness of the total substrate may be less than or equal to one hundred micrometers. The device may include a plated metal layer that is placed and wire bonded, where the plated metal layer may be less than fifty micrometers or less than one hundred micrometers thick, in some examples. The bottom of the semiconductor die may be electrically connected to a conductive pad that has a thickness of less than one hundred micrometers. The substrate may include molding compound that has relatively high compression strength but relatively low shear strength.

Therefore, when an external force is applied to a substrate extension of the device, the substrate may be configured to break relatively easily, especially at breakpoints on the device. The breakpoints may be located at an interface of the substrate and a conductive pad or at a recess in the substrate. The substrate may be thinner at the recess than at other points on the substrate. In the example of a printer cartridge, the quality control may ensure the performance of the original ink cartridges, the ink inside cartridges, and/or the entire printer device. Modification or refilling of the cartridges may result in lower quality printing. The breakable substrate may uphold the quality control performed by the manufacturer and may protect the brand reputation performed by the manufacturer.

FIG. 1 is a conceptual block diagram of a semiconductor die 6 mounted on a substrate 4, in accordance with some examples of this disclosure. Device 2 may include substrate 4, semiconductor die 6, and conductive pad 8. In some examples, device 2 may be part of a larger system, such as a printer ink cartridge, a power cord or a communications cord for an electronic device, and/or any other suitable device.

Substrate 4 may include molding compound, a pre-molded leadframe, and/or any other suitable material. Substrate 4 may have relatively high compressive strength in order to withstand forces during normal operation. However, substrate 4 may have relatively low shear strength or torsional strength, such that substrate 4 may have a relatively low torque tolerance. In response to a force being applied in the positive or negative z-axis direction to substrate 4, substrate 4 may have a relatively low shear strength.

Substrate 4 may include a thickness in the z-axis direction that is less than a typical PCB substrate. A typical PCB substrate may include a thickness of more than one millimeter and may be made of FR4 material. The FR4 material at a thickness of more than one millimeter may be overly robust for some applications that do not include heavy mechanical loads. In some examples, the z-axis thickness of substrate 4 may be less than four hundred micrometers, less than two hundred micrometers, or even less than one hundred micrometers. In some examples, substrate 4 may have a length of approximately eight millimeters in the x-axis direction and a width of approximately nine millimeters in the y-axis direction.

Semiconductor die 6 may include circuitry, such as authentication circuitry, communication circuitry, driver circuitry, and/or any other suitable type of circuitry. Semiconductor die 6 may include one or more input/output (IO) nodes configured to electrically connect conductive pad 8 and/or any other conductive elements in substrate 4. In some examples, semiconductor die 6 may include six or eight IO nodes, such as pins and/or leads. In some examples, semiconductor die 6 may be encapsulated in molding compound, such as glob-top technology and/or over-molding technology.

Conductive pad 8 may extend through substrate 4. In some examples, device 2 may include more than one conductive pad (see FIGS. 2A-7). Conductive pad 8 may include conductive material such as copper, gold, aluminum, solder, and/or any other suitable conductive material. Conductive pad 8 may be coupled to substrate 4 at interface 12. Conductive pad 8 may be configured to electrically connect to semiconductor die 6 through one or more IO nodes of semiconductor die 6. Conductive pad 8 may also be electrically connected to an outer conductive element positioned on substrate 4 (see FIGS. 3A-4).

Conductive pad 8 may include an exposed surface area on first side 14 of substrate 4 and an exposed surface area on second side 16 of substrate 4. The exposed surface area of conductive pad 8 on first side 14 of substrate 4 may be greater (i.e., larger) than the exposed surface area of conductive pad 8 on second side 16 of substrate 4. For example, the exposed surface area on first side 14 may be approximately one square millimeter, and the exposed surface area on second side 16 may be approximately 0.7 square millimeters. In some examples, the exposed surface area of conductive pad 8 on first side 14 may be larger than the exposed surface area by at least five percent or at least ten percent.

Figure 8:
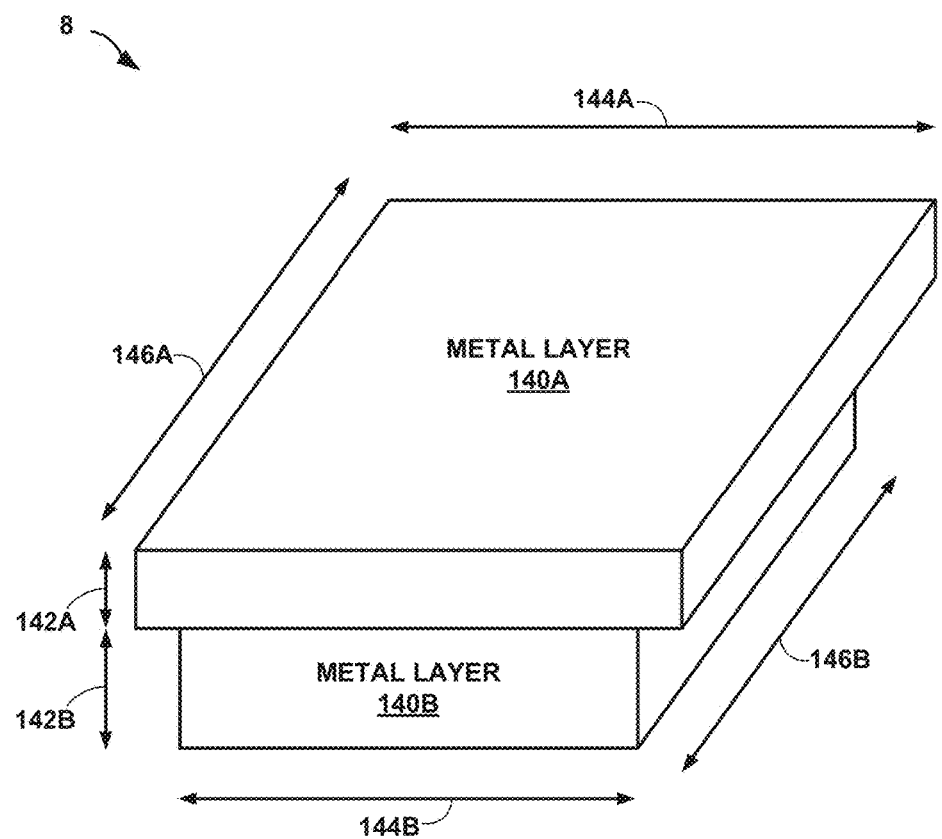
FIG. 8 is a perspective-view diagram of an example of the conductive pad of FIG. 1, in accordance with some examples of this disclosure.

In some examples, conductive pad 8 may include two or more metal layers (see, e.g., FIG. 8). The two or more metal layers of conductive pad 8 may be stacked in the z-axis direction. A first metal layer of conductive pad 8 may be exposed on first side 14 of substrate 4, and a second metal layer of conductive pad 8 may be exposed on second side 16 of substrate 4. The second metal layer on second side 16 may be thicker in the z-axis direction than the first metal layer on first side 14, but the second metal layer may be longer in the x-axis direction and/or y-axis direction than the first metal layer. Each of the first metal layer and the second metal layer of conductive pad 8 may have a three-dimensional rectangular shape. The length, width, and thickness of each of the metal layers may correspond to the dimensions in the x-axis, y-axis, and z-axis directions.

Substrate extension 10 may be part of substrate 4. Substrate 4 may extend laterally from interface 12 to define substrate extension 10. When a force is applied to substrate extension 10 on first side 14 of substrate 4, device 2 may be configured to break at a breakpoint, such as interface 12. The force applied to substrate extension 10 may be in the direction of the positive or negative z-axis, such that substrate extension 10 may break off from conductive pad 8, semiconductor die 6, and the remainder of substrate 4. In some examples, the force may be applied to first side 14 of substrate 4, such that the force is in the direction of the negative z-axis.

Interface 12 may be located where substrate 4 meets conductive pad 8. Substrate 4 may be coupled to conductive pad 8 at interface 12, and substrate 4 may extend laterally (i.e., in the x-axis direction and/or the y-axis direction) from interface 12 to define substrate extension 10. Interface 12 may be formed by forming conductive pad 8 and then forming substrate 4 around conductive pad 8. Additionally or alternatively, substrate 4 may be formed, and then conductive pad 8 may be positioned in substrate 4, such as before the material of substrate 4 hardens.

In accordance with the techniques of this disclosure, device 2 may include a breakpoint at interface 12, where the breakpoint defines a torque tolerance that is less than a torque tolerance of device 2 at other points. The torque tolerance may be lower at interface 12 than at other points because interface 12 may have lower shear strength (i.e., forces applied in the z-axis direction to substrate extension 10). Moreover, the torque tolerance may be lower at interface 12 because of the shape and/or configuration of conductive pad 8. In particular, conductive pad 8 may have larger dimensions in the x-axis and y-axis directions on first side 14 than on second side 16. As a result of the dimensions of conductive pad 8, interface 12 may be more likely to break in response to a force applied to substrate extension 10 in the negative z-axis direction, as compared to a force applied to substrate extension 10 in the positive z-axis direction. Thus, a force applied on substrate extension 10 in the negative z-axis direction may cause a fracture at interface 12.

The breakpoint of device 2 may prevent unauthorized uses of device 2 by preventing or impeding attempts to remove device 2 from a larger system. A user may attempt to remove device 2 in order to attach device 2 to an unauthorized system. A user may also attempt to remove device 2 in order to modify the system to which device 2 is attached. The user may re-attach device 2 to the system after the modification is complete. Thus, device 2 may fail or break at the breakpoint of device 2 (e.g., interface 12) when a user attempts to remove device 2 from the system.

Device 2 may be configured to break at a breakpoint by snapping, cracking, fracturing, and/or any other mechanical change that renders device 2 unable to function properly. For example, if the breakpoint is located at interface 12, device 2 may be configured to break by substrate 4 breaking off from conductive pad 8. In some examples, substrate extension 10 may include one or more outer conductive elements so that, when substrate 4 breaks off from conductive pad 8, device 2 no longer functions properly. The lower torque tolerance of the breakpoint may prevent an unauthorized modification of device 2 or a larger system, thereby upholding the quality control performed by the manufacturer.

Figure 2B:
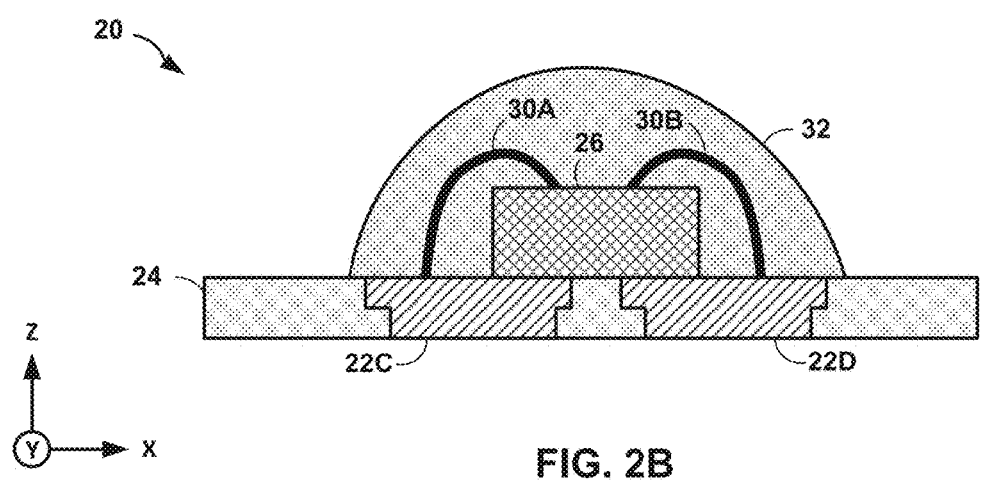
FIG. 2B is a side-view diagram of the device of FIG. 2A, in accordance with some examples of this disclosure.

FIG. 2A is a bottom-view diagram of a device 20 including conductive pads 22A-22D, in accordance with some examples of this disclosure. FIG. 2B is a side-view diagram of device 20, in accordance with some examples of this disclosure. Device 20 may include conductive pads 22A-22D, substrate 24, semiconductor die 26, bond wires 30A and 30B, and encapsulating material 32. Semiconductor die 26 may be electrically connected to conductive pads 22A-22D by soldering, wire bonding, and/or any other suitable methods. For example, as depicted in FIG. 2B, semiconductor die 26 may be electrically connected to conductive pad 22C by bond wire 30A and may be electrically connected to conductive pad 22D by bond wire 30B.

Each of conductive pads 22A-22D may be exposed on the bottom side of substrate 24, as depicted in FIGS. 2A and 2B, where the top side is in the positive x-axis direction and the bottom side is in the negative x-axis direction. The exposed area of each of conductive pads 22A-22D may allow for electrical connections between semiconductor die 26 and other objects or devices. Each of conductive pads 22A-22D may be exposed on the top side of substrate 24 until semiconductor die 26 and encapsulating material 32 are placed on the top side of substrate 24. FIG. 2B depicts conductive pads 22C and 22D as including a top layer and a bottom layer. The top layers of conductive pads 22C and 22D may have a larger length in the x-axis direction and a larger width in the y-axis direction, as compared to the bottom layers of conductive pads 22C and 22D. As a result, the top layers of conductive pads 22C and 22D may be configured to not fall through to the bottom side of substrate 24 because the exposed area of conductive pads 22C and 22D on the bottom side of substrate 24 may be smaller than the exposed area of conductive pads 22C and 22D on the top side of substrate 24. Device 20 may be weaker, or more likely to break, at the interface between each of conductive pads 22A-22D and substrate 24 in response to a force applied to an outer portion of substrate 24 in the negative z-axis direction, as compared to a force applied to the outer portion of substrate 24 in the positive z-axis direction.

Encapsulating material 32 may include molding compound and/or any other suitable insulating material. Encapsulating material 32 may be applied using glob-top technology and/or over-molding technology. Encapsulating material 32 may be configured to electrically isolate semiconductor die 26 and bond wires 30A and 30B from other devices. Encapsulating material 32 may be configured to protect semiconductor die 26 from damage and/or contact with outside objects.

Figure 3A:
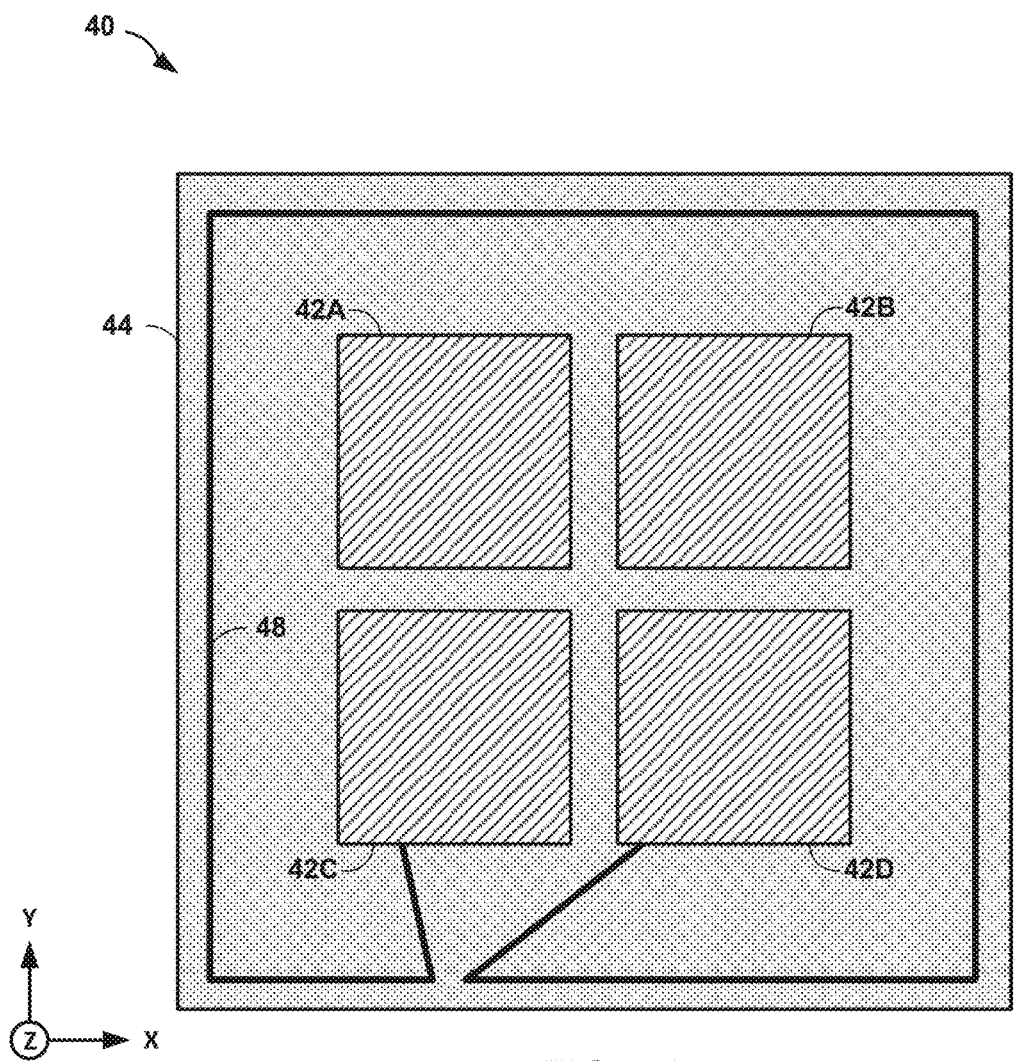
FIGS. 3A and 3B are bottom- and side-view diagrams of a device including a conductive element along the periphery of a substrate, in accordance with some examples of this disclosure.
Figure 3B:
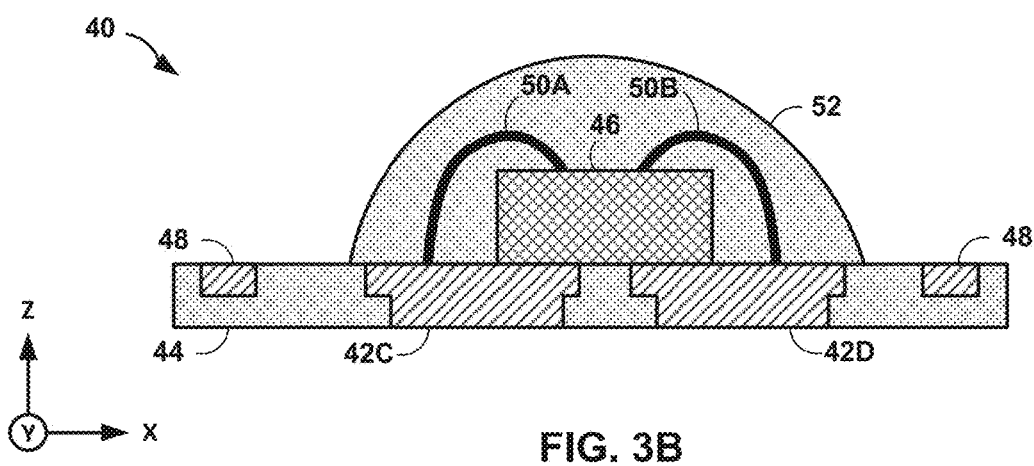

FIGS. 3A and 3B are bottom- and side-view diagrams of a device 40 including a conductive element 48 along the periphery of a substrate 44, in accordance with some examples of this disclosure. Conductive element 48 (i.e., "outer conductive element") may be electrically connected to conductive pads 42C and 42D. Conductive element 48 may be an electrical trace such as a fine trace line along the peripheral of substrate 44. In some examples, substrate 44 may define a recess that is positioned between semiconductor die 46 and conductive element 48.

When a user attempts to detach device 40 from a larger system, the attempt may damage device 40. Even a small amount of damage on substrate 44 may prevent device 40 from functioning properly because conductive element 48 may no longer be electrically connected to the semiconductor die 46 and/or to one or more of conductive pads 42A-42D. The damage to the device may induce an open circuit on the device and may prevent any reuse of the authentication chip.

Device 40 may include a breakpoint at an interface between each of conductive pads 42A-42D and substrate 44. The interface may have a lower torque tolerance than other points on substrate 44. Device 40 may be configured to break at the interface in response to a force being applied to an end of substrate 44. In some examples, device 40 may be configured to break more easily in response to a force being applied to the top side of substrate 44 in the negative z-axis direction because of the shape of the interface. If device 40 breaks at an interface between one of conductive pads 42A-42D, conductive element 48 may be configured to electrically disconnect from conductive pads 42A-42D. Device 40 may not function properly when conductive element 48 is electrically disconnected from conductive pad 42C or 42D.

In some examples, device 40 may include more than one outer conductive element, such as conductive element 48. Additionally or alternatively, conductive element 48 may be split into two or more conductive elements. Each of the outer conductive elements of device 40 may be electrically connected to one or more of conductive pads 42A-42D and/or semiconductor die 46.

Figure 4:
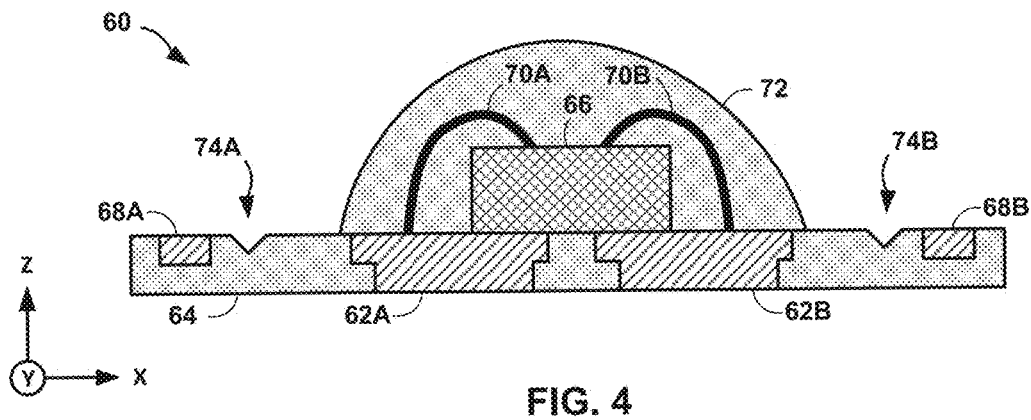
FIG. 4 is a side-view diagram of a device including a substrate including two recesses positioned between a semiconductor die and a conductive element, in accordance with some examples of this disclosure.

FIG. 4 is a side-view diagram of a device 60 including a substrate 64 including two recesses 74A and 74B positioned between a semiconductor die 66 and a conductive element 68A and 68B, in accordance with some examples of this disclosure. In some examples, substrate 64 may define recesses 74A and 74B that are positioned on a top side of substrate 64. Each of recesses 74A and 74B may be a trench and/or a groove in substrate 64. Recesses 74A and 74B may be positioned on the top side of substrate 64, such as an area that is not covered with glob-top material (i.e., encapsulating material 72) or over-molding material. Any attempt by a user to remove the COB (i.e., device 60) from the larger system (e.g., an ink cartridge) to which device 60 is attached, even with a small force, may result in cracking of substrate 64 at either or both of recesses 74A and 74B.

Either or both of recesses 74A and 74B may be a breakpoint of device 60. In some examples, the torque tolerance of device 60 at either or both of recesses 74A and 74B may be less than the torque tolerance of device 60 at other points. Substrate 64 may have lower strength at either or both of recesses 74A and 74B, as compared to other portions of substrate 64, because of the reduced thickness of substrate 64 in the z-axis direction at either or both of recesses 74A and 74B. When a force is applied in the negative z-axis direction to an end of substrate 64, device 60 may be more likely to break at either or both of recesses 74A and 74B, or an interface between substrate 64 and one of conductive pads 62A-62D, as compared to other points on device 60.

In some examples, substrate 64 may have a thickness at other points of less than four hundred micrometers, less than two hundred micrometers, or even less than one hundred micrometers. At the either or both of recesses 74A and 74B, substrate 64 may have a thickness of less than two hundred micrometers, less than one hundred micrometers, or even less than fifty micrometers. At the either or both of recesses 74A and 74B, substrate 64 may have a thickness that is at least ten, twenty, twenty-five, or thirty percent less than the average thickness of substrate 64 at other points on substrate 64.

Although FIG. 4 depicts device 60 as including two recesses 74A and 74B, in some examples, device 60 may include one, two, three, four, or more recesses. Similarly, although FIG. 4 depicts device 60 as including two conductive elements 62A and 62B, in some examples, device 60 may include one, two, three, four, or more conductive elements. In some examples, conductive element 62A may be electrically connected to conductive element 62B such that conductive elements 62A and 62B function as one conductive element.

Figure 5:
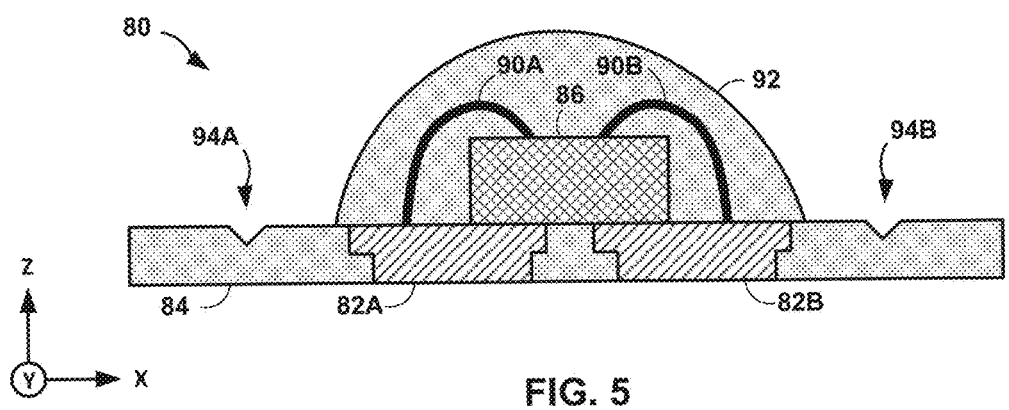
FIG. 5 is a side-view diagram of a device including a substrate including two recesses, in accordance with some examples of this disclosure.

FIG. 5 is a side-view diagram of a device 80 including a substrate 84 including two recesses 94A and 94B, in accordance with some examples of this disclosure. Either or both of recesses 94A and 94B may be a breakpoint of device 80 because of the reduced thickness of substrate 84 in the z-axis direction at either or both of recesses 94A and 94B. Even if device 80 does not include an outer conductive element, device 80 may be configured to not function properly if device 80 breaks at either or both of recesses 94A and 94B. For example, device 80 may not properly attach to a larger system if device 80 breaks at either or both of recesses 94A and 94B.

Figure 6:
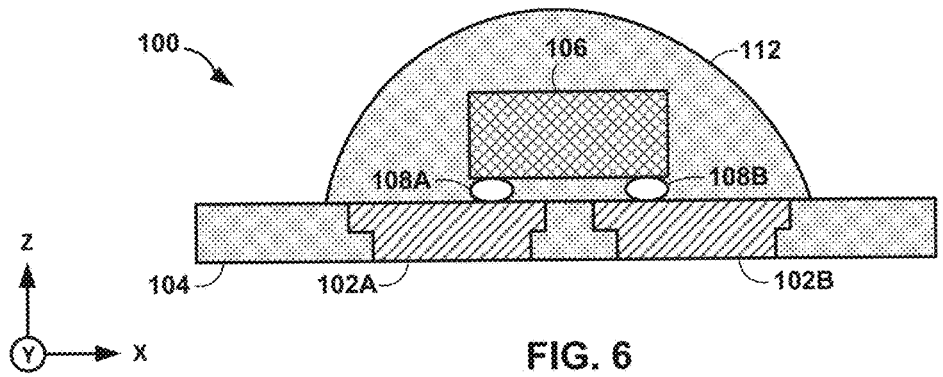
FIG. 6 is a side-view diagram of a device implementing flip-chip technology, in accordance with some examples of this disclosure.

FIG. 6 is a side-view diagram of a device 100 implementing flip-chip technology, in accordance with some examples of this disclosure. Device 100 may include solder bumps 108A and 108B instead of or in addition to bond wires. Solder bumps 108A and 108B may function as IO nodes of semiconductor die 106 and may electrically connect semiconductor die 106 to conductive pads 102A and 102B. Device 100 may include encapsulating material 112, such as glob-top technology and/or over-molding technology.

Figure 7:
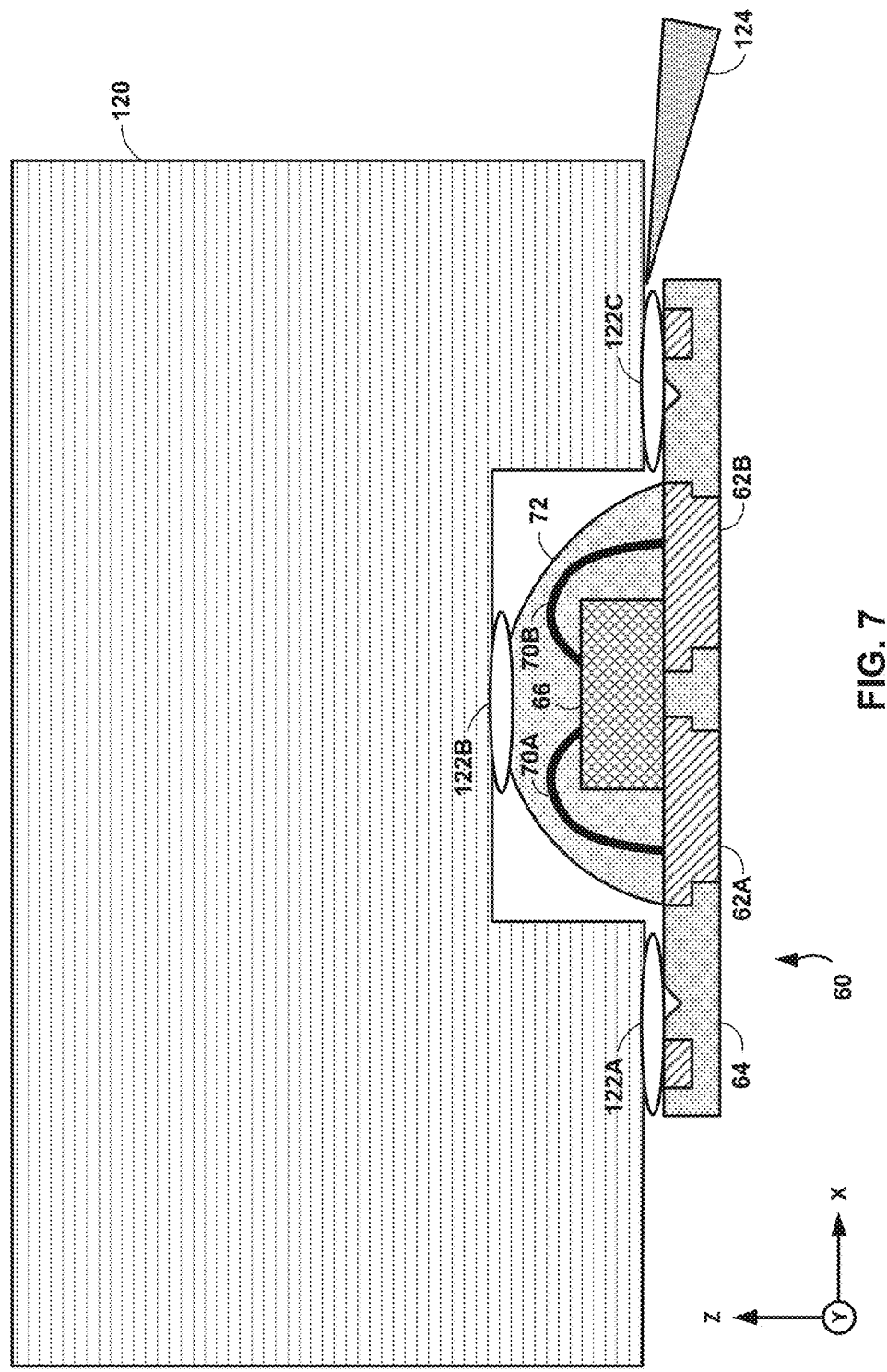
FIG. 7 is a side-view diagram of the device of FIG. 4 attached to a second device, in accordance with some examples of this disclosure.

FIG. 7 is a side-view diagram of the device 60 attached to a second device 120, in accordance with some examples of this disclosure. In some examples, devices 2, 20, 40, 80, or 100 of FIGS. 1-6 may be attached to a second device, such as device 120. Device 60 may be attached to device 120 by adhesive elements 122A-122C. In some examples, adhesive elements 122A-122C may include glue, tape, adhesive paste, solder, and/or any other suitable element.

A user may attempt to remove device 60 from device 120 with tool 124, which may be a knife, a screwdriver, and/or any other tool for applying a force to device 60. The user may apply a force in the negative z-axis direction to the top side of substrate 64 near adhesive element 122C. The force applied to substrate 64 in the negative z-axis direction may cause torque at points on device 60, such as at a recess of substrate 64 or the interface between substrate 64 and conductive pad 62B. Device 60 may be configured to break at a breakpoint such as at the recess or the interface.

If another device with a more robust substrate was attached to device 120, the other device may not be configured to break in response to a force being applied to the top side of substrate 64. The other device may include a PCB that is overly robust, such that a user may remove the other device without breaking the PCB. Moreover, the other device may not include a breakpoint such as a recess or an interface between a conductive pad and a substrate. As a result, the user may be able to remove, modify, and reattach the other device, which may result in a lower-quality device.

In some examples, device 120 may be a printer cartridge or a cord for an electronic device. Device 60 may be an authentication device, and semiconductor die 66 may include authentication circuitry, such that device 120 may not operate unless device 60 is attached to device 120. A user may remove device 60 to modify or refill device 120, and the user may then attempt to reattach device 60 to device 120. If device 60 is configured to break in response to a force applied to the top side of substrate 64, the user may not be able to reattach device 60 to device 120, or another device, and device 120 may not function properly.

FIG. 8 is a perspective-view diagram of an example of conductive pad 8, in accordance with some examples of this disclosure. In some examples, conductive pad 8 may include metal layers 140A and 140B, which may include copper, aluminum, tin, gold, and/or any other suitable conductive material. Conductive pad 8 may be attached to a substrate such that the interface of conductive pad 8 and substrate 4 of FIG. 1 is a breakpoint. The geometry of conductive pad 8 may cause the interface to have a lower torque tolerance, as compared to other points on device 2 of FIG. 1.

Thickness 142A of metal layer 140A in the z-axis direction may be less than thickness 142B of metal layer 140B. In some examples, thickness 142A may be greater than ten micrometers or twenty micrometers and less than forty micrometers or fifty micrometers. In some examples, thickness 142B may be greater than twenty micrometers or thirty micrometers and less than sixty, seventy, or eighty micrometers. In some examples, thickness 142A may be in the range of five micrometers to thirty micrometers, and thickness 142B may be in the range of thirty micrometers to one hundred micrometers. Length 144A of metal layer 140A in the x-axis direction may be greater than length 144B of metal layer 140B, and width 146A in the y-axis direction may be greater than width 146B. The greater length and width of metal layer 140A, as compared to metal layer 140B, may prevent metal layer 140A from falling in the negative z-axis direction through substrate 4 of FIG. 1. The greater length and width of metal layer 140A may also reduce the torque tolerance of device 2 with respect to forces applied to substrate extension 10 in the negative z-axis direction, as compared to forces applied to substrate extension 10 in the positive z-axis.

Figure 9:
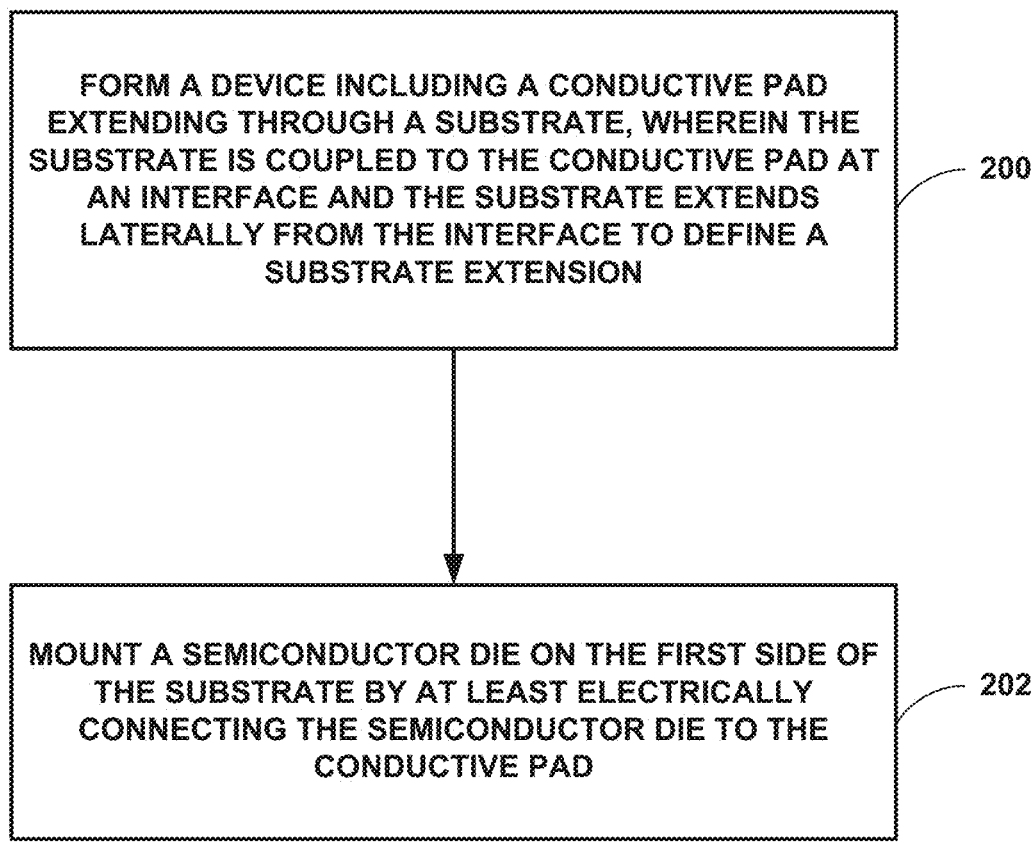
FIG. 9 is a flowchart illustrating an example technique for constructing a device including a semiconductor die mounted on a substrate, in accordance with some examples of this disclosure.

FIG. 9 is a flowchart illustrating an example technique for constructing a device including a semiconductor die mounted on a substrate, in accordance with some examples of this disclosure. The technique of FIG. 9 is described with reference to device 2 in FIG. 1, although other components, such as devices 20, 40, 60, 80, and 100 may exemplify similar techniques.

The techniques of FIG. 9 include forming device 2 including conductive pad 8 extending through substrate 4 (200). Substrate 4 may be coupled to conductive pad 8 at interface 12 and substrate 4 may extend laterally from interface 12 to define substrate extension 10. Device 2 may include a breakpoint that defines a torque tolerance that is less than a torque tolerance of device 2 at other points. Device 2 may be configured to break at the breakpoint in response to force being applied to substrate extension 10 on the first side of substrate 4. Interface 12 may be a breakpoint because of the shape of conductive pad 8, which may have a larger surface area on first side 14 than on second side 16. In addition, substrate extension 10 may define a recess that may be a second breakpoint.

The techniques of FIG. 9 further include mounting semiconductor die 6 on first side 14 of substrate 4 (202). Mounting semiconductor die 6 may include electrically connecting semiconductor die 6 to conductive pad 8. When device 2 breaks, semiconductor die 6 may lose its electrical connection with conductive pad 8, a conductive element positioned on substrate 4, and/or another device. A user who attempts to remove device 2 from another device, such as an ink cartridge, may no longer be able to use device 2 after device 2. Thus, the breakable substrate of device 2 may prevent unauthorized uses of device 2.

The following numbered examples demonstrate one or more aspects of the disclosure.

Example 1

A device includes a substrate and a conductive pad extending through the substrate, wherein the substrate is coupled to the conductive pad at an interface and the substrate extends laterally from the interface to define a substrate extension. In some examples, the device also includes a semiconductor die mounted on the first side of the substrate. In some examples, the device includes a breakpoint that defines a torque tolerance that is less than a torque tolerance of the device at other points. In some examples, the device is configured to break at the breakpoint in response to force being applied to the substrate extension on the first side of the substrate.

Example 2

The device of example 1, further including an outer conductive element positioned on the first side of the substrate, wherein the outer conductive element is electrically connected to the conductive pad.

Example 3

The device of examples 1 or 2 or any combination thereof, wherein the substrate defines a recess that is positioned between the semiconductor die and the outer conductive element, wherein the breakpoint is located at the recess.

Example 4

The device of examples 1-3 or any combination thereof, wherein a thickness of the substrate at the recess is less than one hundred micrometers.

Example 5

The device of examples 1-4 or any combination thereof, wherein an exposed surface area of the conductive pad on a first side of the substrate is greater than an exposed surface area of the conductive pad on a second side of the substrate.

Example 6

The device of examples 1-5 or any combination thereof, wherein the conductive pad is a first conductive pad, and wherein the substrate further includes a second conductive pad extending through the substrate. An exposed surface area of the second conductive pad on a first side of the substrate is greater than an exposed surface area of the second conductive pad on a second side of the substrate. The semiconductor die is electrically connected to the first conductive pad, and the semiconductor die is electrically connected to the second conductive pad.

Example 7

The device of examples 1-6 or any combination thereof, wherein the conductive pad includes a first metal layer that is exposed on the first side of the substrate, wherein a thickness of the first metal layer is greater than ten micrometers and less than forty micrometers. The conductive pad also includes a second metal layer that is exposed on the second side of the substrate, wherein a thickness of the second metal layer is greater than twenty micrometers and less than seventy micrometers.

Example 8

The device of example 7, wherein a width of the first metal layer is greater than a width of the second metal layer, and wherein a length of the first metal layer is greater than a length of the second metal layer.

Example 9

The device of examples 1-8 or any combination thereof, wherein a thickness of the substrate is less than two hundred micrometers.

Example 10

The device of examples 1-9 or any combination thereof, wherein the substrate includes molding compound.

Example 11

The device of examples 1-10 or any combination thereof, wherein the breakpoint is located at the interface.

Example 12

The device of examples 1-11 or any combination thereof, further including an electrical trace positioned on the substrate extension, wherein the substrate defines a recess that is positioned between the semiconductor die and the electrical trace, and wherein the electrical trace is electrically connected to the conductive pad.

Example 13

A method includes forming a device including a conductive pad extending through a substrate, wherein the substrate is coupled to the conductive pad at an interface and the substrate extends laterally from the interface to define a substrate extension. The device includes a breakpoint that defines a torque tolerance that is less than a torque tolerance of the device at other points, and the device is configured to break at the breakpoint in response to force being applied to the substrate extension on the first side of the substrate. The method also includes mounting a semiconductor die on the first side of the substrate, wherein mounting the semiconductor die includes electrically connecting the semiconductor die to the conductive pad.

Example 14

The method of example 13, further including forming an outer conductive element on the first side of the substrate. The method also includes forming a recess in the substrate between the semiconductor die and the outer conductive element.

Example 15

The method of examples 13-14 or any combination thereof, further including forming a second metal layer of the conductive pad, wherein a thickness of the second metal layer is greater than twenty micrometers and less than seventy micrometers. The method also includes forming a first metal layer of the conductive pad on the second metal layer, wherein a thickness of the first metal layer is greater than ten micrometers and less than forty micrometers. Forming the substrate includes forming the substrate around the first metal layer of the conductive pad and around the second metal layer of the conductive pad.

Example 16

The method of examples 13-15 or any combination thereof, wherein a thickness of the substrate is less than two hundred micrometers.

Example 17

A device includes a substrate and a conductive pad extending through the substrate, wherein an exposed surface area of the conductive pad on a first side of the substrate is greater than an exposed surface area of the conductive pad on a second side of the substrate. The substrate is coupled to the conductive pad at an interface and the substrate extends laterally from the interface to define a substrate extension. The device also includes a semiconductor die mounted on the first side of the substrate and electrically connected to the conductive pad. The device further includes an outer conductive element positioned on a first side of the substrate extension, wherein the substrate extension defines a recess that is positioned between the semiconductor die and the outer conductive element. The device includes a first breakpoint at the interface and a second breakpoint at the recess, wherein each breakpoint of the first breakpoint and the second breakpoint defines a torque tolerance that is less than a torque tolerance of the device at other points. The device is configured to break at the first breakpoint or the second breakpoint in response to force being applied to the substrate extension on the first side of the substrate.

Example 18

The device of example 17, further including a printer cartridge, wherein the first side of the substrate extension is adhered to the printer cartridge.

Example 19

The device of examples 17-18 or any combination thereof, wherein the conductive pad includes a first metal layer that is exposed on the first side of the substrate, wherein a thickness of the first metal layer is greater than ten micrometers and less than forty micrometers. The conductive pad also includes a second metal layer that is exposed on the second side of the substrate. A thickness of the second metal layer is greater than twenty micrometers and less than seventy micrometers, a width of the first metal layer is greater than a width of the second metal layer, and a length of the first metal layer is greater than a length of the second metal layer.

Example 20

The device of examples 17-19 or any combination thereof, wherein a thickness of the substrate is less than two hundred micrometers.

Various examples of the disclosure have been described. Any combination of the described systems, operations, or functions is contemplated. These and other examples are within the scope of the following claims.

What is claimed is:

1. A device comprising:
    a substrate;
        a first conductive pad extending through the substrate, wherein the substrate is coupled to the first conductive pad at an interface and the substrate extends laterally from the interface to define a substrate extension, and wherein an exposed surface area of the first conductive pad on a first side of the substrate is greater than or equal to an exposed surface area of the first conductive pad on a second side of the substrate;
    a second conductive pad extending through the substrate, wherein an exposed surface area of the second conductive pad on the first side of the substrate is greater than or equal to an exposed surface area of the second conductive pad on the second side of the substrate; and
    a semiconductor die mounted on the first side of the substrate,
    wherein the semiconductor die is electrically connected to the first conductive pad,
    wherein the semiconductor die is electrically connected to the second conductive pad, and
    wherein the device includes a breakpoint that defines a torque tolerance that is less than a torque tolerance of the device at other points, and wherein the device is configured to break at the breakpoint in response to force being applied to the substrate extension on the first side of the substrate.

2. The device of claim 1, further comprising an outer conductive element positioned on the first side of the substrate, wherein the outer conductive element is electrically connected to the first conductive pad.

3. The device of claim 2, wherein the substrate defines a recess that is positioned between the semiconductor die and the outer conductive element, wherein the breakpoint is located at the recess.

4. The device of claim 3, wherein a thickness of the substrate at the recess is less than one hundred micrometers.

5. The device of claim 1, wherein the exposed surface area of the first conductive pad on the first side of the substrate is greater than the exposed surface area of the first conductive pad on the second side of the substrate.

6. The device of claim 5,
    wherein the exposed surface area of the second conductive pad on the first side of the substrate is greater than the exposed surface area of the second conductive pad on the second side of the substrate.

7. The device of claim 1, wherein the first conductive pad comprises:
    a first metal layer that is exposed on the first side of the substrate, wherein a thickness of the first metal layer is greater than ten micrometers and less than forty micrometers; and
    a second metal layer that is exposed on the second side of the substrate, wherein a thickness of the second metal layer is greater than twenty micrometers and less than seventy micrometers.

8. The device of claim 7, wherein a width of the first metal layer is greater than a width of the second metal layer, and wherein a length of the first metal layer is greater than a length of the second metal layer.

9. The device of claim 1, wherein a thickness of the substrate is less than two hundred micrometers.

10. The device of claim 1, wherein the substrate includes molding compound.

11. The device of claim 1, wherein the breakpoint is located at the interface.

12. The device of claim 11, further comprising an electrical trace positioned on the substrate extension, wherein the substrate defines a recess that is positioned between the semiconductor die and the electrical trace, and wherein the electrical trace is electrically connected to the first conductive pad.

13. A method comprising:
    forming a device including a conductive pad extending through a substrate, wherein the substrate is coupled to the conductive pad at an interface and the substrate extends laterally from the interface to define a substrate extension, wherein the device includes a breakpoint that defines a torque tolerance that is less than a torque tolerance of the device at other points, and wherein the device is configured to break at the breakpoint in response to force being applied to the substrate extension on a first side of the substrate;
    forming a second metal layer of the conductive pad;
    forming a first metal layer of the conductive pad on the second metal layer, wherein forming the device includes forming the substrate around the first metal layer of the conductive pad and around the second metal layer of the conductive pad; and
    mounting a semiconductor die on the first side of the substrate, wherein mounting the semiconductor die includes electrically connecting the semiconductor die to the conductive pad.

14. The method of claim 13, further comprising:
    forming an outer conductive element on the first side of the substrate; and forming a recess in the substrate between the semiconductor die and the outer conductive element.

15. The method of claim 13,
wherein a thickness of the second metal layer is greater than twenty micrometers and less than seventy micrometers
and wherein a thickness of the first metal layer is greater than ten micrometers and less than forty micrometers.

16. The method of claim 13, wherein a thickness of the substrate is less than two hundred micrometers.

17. A device comprising:
a substrate;
a conductive pad extending through the substrate, wherein an exposed surface area of the conductive pad on a first side of the substrate is greater than or equal to an exposed surface area of the conductive pad on a second side of the substrate, wherein the substrate is coupled to the conductive pad at an interface and the substrate extends laterally from the interface to define a substrate extension, and wherein the conductive pad comprises:
a first metal layer that is exposed on the first side of the substrate; and
a second metal layer that is exposed on the second side of the substrate, wherein a width of the first metal layer is greater than or equal to a width of the second metal layer, and wherein a length of the first metal layer is greater than or equal to a length of the second metal layer;
a semiconductor die mounted on the first side of the substrate and electrically connected to the conductive pad; and
an outer conductive element positioned on a first side of the substrate extension,
wherein the substrate extension defines a recess that is positioned between the semiconductor die and the outer conductive element, wherein the device includes a first breakpoint at the interface and a second breakpoint at the recess, wherein each breakpoint of the first breakpoint and the second breakpoint defines a torque tolerance that is less than a torque tolerance of the device at other points, and wherein the device is configured to break at the first breakpoint or the second breakpoint in response to force being applied to the substrate extension on the first side of the substrate.

18. The device of claim 17, further comprising a printer cartridge, wherein the first side of the substrate extension is adhered to the printer cartridge.

19. The device of claim 17,
wherein a thickness of the first metal layer is greater than ten micrometers and less than forty micrometers
and wherein a thickness of the second metal layer is greater than twenty micrometers and less than seventy micrometers.

20. The device of claim 17, wherein a thickness of the substrate is less than two hundred micrometers.

\* \* \* \* \*